(12) United States Patent
Choi et al.

(10) Patent No.: US 12,033,565 B2
(45) Date of Patent: Jul. 9, 2024

(54) FLAT LIGHTING DEVICE AND DISPLAY DEVICE USING LIGHT-EMITTING DIODE

(71) Applicant: LG ELECTRONICS INC., Seoul (KR)

(72) Inventors: Wonseok Choi, Seoul (KR); Sungmin Park, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/028,257

(22) PCT Filed: Sep. 25, 2020

(86) PCT No.: PCT/KR2020/013095
§ 371 (c)(1),
(2) Date: Mar. 24, 2023

(87) PCT Pub. No.: WO2022/065554
PCT Pub. Date: Mar. 31, 2022

(65) Prior Publication Data
US 2023/0401993 A1  Dec. 14, 2023

(51) Int. Cl.
*G09G 3/32* (2016.01)
*G09G 3/20* (2006.01)
*H01L 33/00* (2010.01)

(52) U.S. Cl.
CPC ............ *G09G 3/32* (2013.01); *G09G 3/2092* (2013.01); *H01L 33/0004* (2013.01); *G09G 2310/0278* (2013.01); *G09G 2320/0626* (2013.01)

(58) Field of Classification Search
CPC ....... G09G 3/32; G09G 3/36; G09G 2300/043; G09G 2320/0214; G09G 2330/021
See application file for complete search history.

(56) References Cited

U.S. PATENT DOCUMENTS

| | | | |
|---|---|---|---|
| 2007/0194726 A1* | 8/2007 | Hwang | H05B 41/2855 315/312 |
| 2017/0256209 A1* | 9/2017 | Kang | G09G 3/3413 |
| 2018/0035512 A1* | 2/2018 | Nagao | H05B 45/50 |

FOREIGN PATENT DOCUMENTS

| | | |
|---|---|---|
| KR | 10-2008-0015322 A | 2/2008 |
| KR | 10-2019-0081072 A | 7/2019 |

(Continued)

*Primary Examiner* — Nelson M Rosario
(74) *Attorney, Agent, or Firm* — Birch, Stewart, Kolasch & Birch, LLP

(57) ABSTRACT

The present invention is applicable to a display device-related technical field, and relates to, for example, a flat lighting device and a display device using a light-emitting diode (LED). The present invention relates to a display device including a plurality of individual unit compartment regions, comprising: at least one light-emitting diode provided in the individual unit compartment regions; a gate-on voltage line connected to the light-emitting diode; a scan line for applying a common voltage to the plurality of individual unit compartment regions; a data line for applying individual switching voltages to the plurality of individual unit compartment regions; a driving unit including a driving MOSFET device connected to the light-emitting diode; and a switching unit including a switching MOSFET device connected to the scan line and the data line to perform a switching operation.

20 Claims, 11 Drawing Sheets

(56) References Cited

FOREIGN PATENT DOCUMENTS

| KR | 10-2020-0070061 A | 6/2020 |
|---|---|---|
| KR | 10-2137637 B1 | 7/2020 |

* cited by examiner

FLAT LIGHTING DEVICE AND DISPLAY DEVICE USING LIGHT-EMITTING DIODE

CROSS REFERENCE TO RELATED APPLICATIONS

This application is the National Phase of PCT/KR2020/013095 filed on Sep. 25, 2020, which is hereby expressly incorporated by reference into the present application.

TECHNICAL FIELD

The present disclosure is applicable to a display device-related technical field, and relates to, for example, a planar lighting device and a display device using a light emitting device (LED).

BACKGROUND

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting device that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting device may be proposed. Such light emitting diode has various advantages, such as long lifespan, low power consumption, excellent initial driving characteristics, high vibration resistance, and the like, compared to a filament-based light-emitting device.

Such an LED has conventionally been mainly used for illumination, but gradually constitutes a display pixel or is used as a backlight. Such LED may be used in a package form.

In a case of conventional LED packages, most of them have a parallel connection structure and are based on a printed circuit board (PCB)-based passive matrix (PM) driving, so that a power efficiency thereof may be low.

To compensate for this, thin film transistor (TFT)-based active matrix (AM) driving has been proposed.

To manufacture a circuit for such conventional active matrix (AM) pixel driving using the thin film transistor (TFT), a process of forming the thin film transistor (TFT) and a capacitor on a substrate is required. However, there is a problem in that the manufacturing process of such a thin film transistor (TFT) is complicated.

In one example, a light emitting device driving scheme based on the above-described active matrix scheme may be applied to a planar lighting device for supplying light to the liquid crystal display, for example, a back light unit (BLU) for high luminance driving and local dimming driving. In this regard, the local dimming may refer to a driving scheme of partially turning off the planar lighting device in a dark screen to improve a contrast ratio of the liquid crystal display.

However, the conventional thin film transistor (TFT) described above has a problem in that high current/high voltage driving for driving the back light unit (BLU) with the high luminance is difficult. That is, a withstand voltage of several tens of volts (V) and a driving current of several tens of milliamps (mA) are required depending on the number of connected light emitting devices (LEDs), but this may have limitations in implementation with the thin film transistor (TFT).

In addition, a PCB substrate conventionally used to form the thin film transistor (TFT) has a limitation in forming a fine wiring, which may be disadvantageous in expanding the number of local dimming zones and may have a disadvantage of a high cost compared to a glass substrate.

Therefore, an improvement method for overcoming such problems is required.

SUMMARY

Technical Problem

The present disclosure is to provide a display device or a planar lighting device (a back light unit) including multiple individual unit compartment areas driven by an active matrix (AM) scheme.

In addition, the present disclosure is to provide a display device or a planar lighting device (a back light unit) that may significantly increase the number of local dimming zones that may be driven individually.

In addition, the present disclosure is to provide a display device or a planar lighting device (a back light unit) that may improve a manufacturing efficiency because there is no need to manufacture a thin film transistor (TFT).

Technical Solutions

As a first aspect for achieving the above object, a display device including multiple individual unit compartment areas according to the present disclosure includes at least one light emitting device disposed in an individual unit compartment area, a gate-on voltage line connected to the light emitting device, a scan line for applying a common voltage to the multiple individual unit compartment areas, a data line for applying individual switching voltages to the multiple individual unit compartment areas, a driver including a driving MOSFET connected to the light emitting device, and a switching unit including a switching MOSFET connected to the scan line and the data line to perform a switching operation.

In addition, the switching unit may include a first switching MOSFET, and a second switching MOSFET connected in parallel with the first switching MOSFET.

In addition, the first switching MOSFET and the second switching MOSFET may be connected in a reverse direction.

In addition, the first switching MOSFET and the second switching MOSFET may be connected to each other such that source terminals thereof face each other.

In addition, a parasitic capacitance between a gate and a drain of the switching MOSFET may be smaller than a parasitic capacitance between a gate and a source of the driving MOSFET.

In addition, the light emitting device may be driven in units of the multiple individual unit compartment areas.

In addition, at least one of the driving MOSFET and the switching MOSFET may be mounted on a wiring layer formed on a substrate.

In addition, the substrate may include a glass substrate.

In addition, the driver may not have a separate capacitor.

As a second aspect for achieving the above object, a back light unit for driving a light emitting device in units of multiple individual unit compartment areas includes the at least one light emitting device disposed in an individual unit compartment area, a gate-on voltage line connected to the light emitting device, a scan line for applying a common voltage to the multiple individual unit compartment areas, a data line for applying individual switching voltages to the multiple individual unit compartment areas, a driver including a driving MOSFET connected to the light emitting device, a switching unit including a switching MOSFET connected to the scan line and the data line to perform a switching operation, and an optical sheet located on the light emitting device.

In addition, the individual unit compartment area may correspond to a unit of local dimming.

In addition, the at least one light emitting device disposed in the individual unit compartment area may emit light of a single color.

Advantageous Effects

According to an embodiment of the present disclosure, the following effects are obtained.

First, according to the present disclosure, the display device or the planar lighting device (the back light unit) including the multiple individual unit compartment areas driven by the active matrix (AM) scheme may be provided.

To improve the contrast ratio in the display device that requires the backlight, such as the liquid crystal display device, the local dimming function of the back light unit BLU is required, which may be implemented via the AM driving having the configuration described in the present disclosure.

For the optimal implementation of the local dimming, the larger the number of local dimming zones that may be driven individually, the better. According to the present disclosure, because the number of local dimming zones may theoretically be increased by the number of pixels, the effect of the local dimming may be greatly improved.

Because the display device according to the present disclosure does not require the manufacture of the thin film transistor (TFT), the manufacturing efficiency may be improved and the display panel manufacturing cost may be greatly reduced.

Furthermore, according to another embodiment of the present disclosure, additional advantageous and advantageous effects not mentioned herein may be understood by those skilled in the art upon examination of the entirety of the specification and drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions.

In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting device mentioned in this specification is a concept including an LED, a micro LED, and the like.

Figure 1:
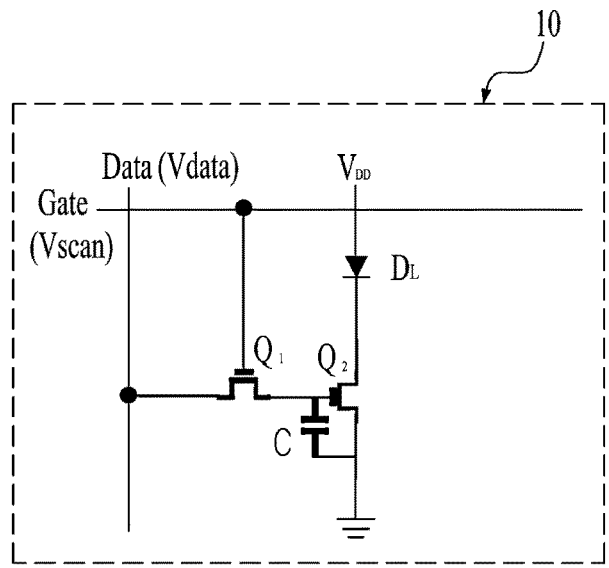
FIG. 1 is a circuit diagram showing an example of a pixel driving circuit that may be applied to the present disclosure.

FIG. 1 is a circuit diagram showing an example of a pixel driving circuit 10 that may be applied to the present disclosure. First, with reference to FIG. 1, characteristics of the pixel driving circuit and related issues will be briefly described.

Referring to FIG. 1, the pixel driving circuit includes a driving thin film transistor Q2 directly connected to a light emitting device $D_L$ and a switching thin film transistor Q1 that is connected to a data line (Data) $V_{DATA}$ and a scan line (Gate) $V_{SCAN}$ to perform a switching operation. In this regard, the scan line may also be referred to as a gate line. A $V_{DATA}$ voltage may be applied to the data line (Data), and a $V_{SCAN}$ voltage may be applied to the scan line (Gate).

As such, there are four main wirings $V_{DD}$, $V_{SS}$, $V_{DATA}$, and $V_{SCAN}$ in a single pixel. Such a thin film transistor (TFT) is connected to each sub-pixel to drive a light emitting device $D_L$ in each sub-pixel. In FIG. 1, $V_{SS}$ is indicated as ground.

A pixel transistor area is defined by the thin film transistor (TFT) connected to the data line $V_{DATA}$ and the scan line $V_{SCAN}$.

In addition, a light emitting area (or a display area) in which the individual light emitting device $D_L$ is driven is defined by the thin film transistor (TFT).

An individual pixel area is defined including such pixel transistor area and light emitting area, and multiple individual pixel areas constitute a display.

As mentioned above, there are the four main wirings $V_{DD}$, $V_{SS}$, $V_{DATA}$, and $V_{SCAN}$ in the single pixel.

Such four wirings $V_{DD}$, $V_{SS}$, $V_{DATA}$, and $V_{SCAN}$ may include the scan line $V_{SCAN}$ connected to the switching thin film transistor Q1, the data line $V_{DATA}$ connected to the driving thin film transistor Q2, the gate-off voltage line $V_{SS}$ connected to the driving thin film transistor Q2, and the gate-on voltage line $V_{DD}$ connected to an anode of the light emitting device $D_L$.

In this regard, the gate-on voltage $V_{DD}$ corresponds to the highest voltage applied to drive the light emitting device $D_L$.

When the driving voltage $V_{DATA}$ and the common voltage $V_{SCAN}$ are applied, the switching operation in which ON/OFF of signal transmission is determined occurs in the switching thin film transistor Q1.

Because of such a switching operation, the driving thin transistor film transistor Q2 determines a voltage substantially applied to the light emitting device $D_L$ based on the driving voltage $V_{DATA}$ and current accordingly flowing through the light emitting device $D_L$.

That is, in the switching thin film transistor Q1, an operation may occur in a switching area, and in the driving thin film transistor Q2, an operation may occur in a linear area before saturation.

In addition, a capacitor C is connected between a gate terminal and a drain terminal of the driving thin film transistor Q2. In such capacitor C, a voltage equal to a difference between a voltage of the voltage line $V_{DD}$ and the driving voltage $V_{DATA}$ is stored, so that the driving thin film transistor Q2 may determine the current flowing through the light emitting device $D_L$ based on the voltage stored in such capacitor C.

As such, a circuit for active matrix (AM) pixel driving using such conventional thin film transistor (TFT) includes two thin film transistors (TFTs) and one capacitor C, and thus, is referred to as a 2T-1C circuit.

A process of forming the thin film transistor (TFT) and the capacitor C on a substrate is required to manufacture the circuit for the active matrix (AM) pixel driving using such conventional thin film transistor (TFT).

However, there is a problem in that, because the manufacturing process of such a thin film transistor (TFT) is complicated, manufacturing of the circuit is difficult.

In one example, a light emitting device driving scheme based on the above-described active matrix scheme may be applied to a planar lighting device for supplying light to a liquid crystal display, for example, a back light unit (BLU) for high luminance driving and local dimming driving. In this regard, the local dimming may refer to a driving scheme of partially turning off the planar lighting device in a dark screen to improve a contrast ratio of the liquid crystal display.

However, the conventional thin film transistor (TFT) described above has a problem in that high current/high voltage driving for driving the back light unit (BLU) with the high luminance is difficult. That is, a withstand voltage of several tens of volts (V) and a driving current of several tens of milliamps (mA) are required depending on the number of connected light emitting devices (LEDs), but this may have limitations in implementation with the thin film transistor (TFT).

In addition, a PCB substrate conventionally used to form the thin film transistor (TFT) has a limitation in forming a fine wiring, which may be disadvantageous in expanding the number of local dimming zones and may have a disadvantage of a high cost compared to a glass substrate.

Therefore, in the present document, it is intended to provide a planar lighting device of an active matrix (AM) structure that does not require the thin film transistor (TFT). In one example, the active matrix (AM) structure that does not require the thin film transistor (TFT) according to the present disclosure may be applied to a display device other than the planar lighting device. That is, the active matrix (AM) structure may be applied to various display devices to which the active matrix (AM) driving is applied. Hereinafter, the planar lighting device will be described as the back light unit (BLU) as an example. Therefore, the terms 'planar lighting device' and 'back light unit' may be used interchangeably.

In the present document, an individual pixel driving area may be referred to as an individual unit compartment area. Hereinafter, the display device or the back light unit including multiple individual unit compartment areas driven by the active matrix (AM) scheme will be described.

As mentioned above, a local dimming function of the back light unit (BLU) is required to improve the contrast ratio in the display device that requires a backlight, such as the liquid crystal display device, and this is able to be implemented via the AM driving.

For optimal implementation of the local dimming, the larger the number of local dimming zones that may be driven individually, the better.

Such unit compartment area of the display device according to the present disclosure may constitute an AM circuit of a 3T (transistor) structure using a substrate with a film wiring formed on a surface and three metal oxide semiconductor field effect transistors (MOSFETs).

Because the display device according to the present disclosure does not require the manufacturing of the thin film transistor (TFT), a manufacturing efficiency may be improved and a display panel manufacturing cost may be greatly reduced.

Figure 2:
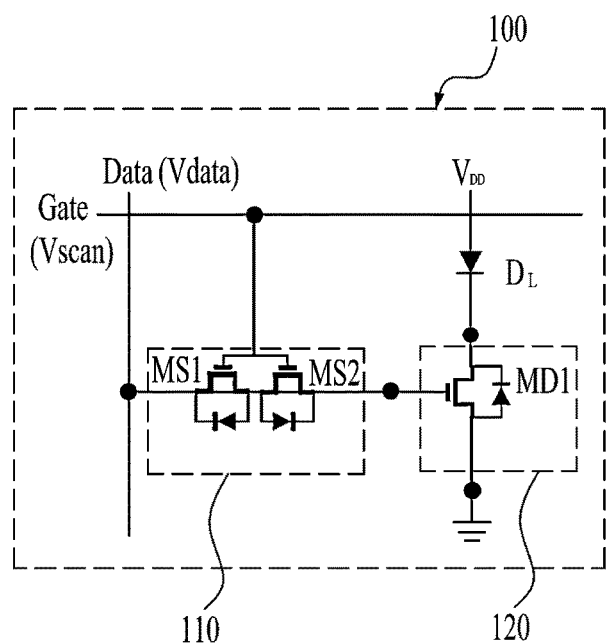
FIG. 2 is a circuit diagram showing a unit compartment area of a display device according to an embodiment of the present disclosure.

FIG. 2 is a circuit diagram showing a unit compartment area of a display device according to an embodiment of the present disclosure.

Referring to FIG. 2, a unit compartment area 100 may include a switching unit 110 and a driver 120. In this regard, the switching unit 110 and the driver 120 may include the metal oxide semiconductor field effect transistor (MOSFET).

For example, the switching unit 110 may include two MOSFETs MS1 and MS2, and the driver 120 may include one MOSFET MD1.

That is, the switching unit 110 may include the first switching MOSFET MS1 and the second switching MOSFET MS2 connected in parallel with the first switching MOSFET MS1 with respect to the scan line (Gate; gate line). In this regard, the first switching MOSFET MS1 and a gate terminal of the first switching MOSFET MS1 may be commonly connected to the scan line (Gate; gate line).

The first switching MOSFET MS1 and the second switching MOSFET MS2 may be connected with each other in series with respect to the data line (Data). In this regard, the first switching MOSFET MS1 and the second switching MOSFET MS2 may be connected to each other in a reverse direction.

Specifically, the first switching MOSFET MS1 and the second switching MOSFET MS2 may be connected to each other such that source terminals thereof face each other. That is, a signal of the switching unit 110 may be input/output via drain terminals.

The second switching MOSFET MS2 of the switching unit 110 may be connected to the driving MOSFET MD1 of the driver 120. That is, the drain terminal of the second switching MOSFET MS2 may be connected to a gate terminal of the driving MOSFET MD1.

As such, the unit compartment area 100 includes the drive unit 120 directly connected to the light emitting device $D_L$ and the switching unit 110 that is connected to the data line (Data) $V_{DATA}$ and the scan line (Gate) $V_{SCAN}$ to perform the switching operation. In this regard, the scan line (Gate) may also be referred to as the gate line. The $V_{DATA}$ voltage may be applied to the data line (Data), and the $V_{SCAN}$ voltage may be applied to the scan line (Gate). As such, there are the four main wirings $V_{DD}$, $V_{SS}$, $V_{DATA}$, and $V_{SCAN}$ in the unit compartment area. In FIG. 2 and following drawings, $V_{SS}$ is indicated as the ground.

In some cases, the unit compartment area 100 may correspond to a unit sub-pixel area. That is, when the unit compartment area 100 of the present disclosure is applied to the display device, it may correspond to a unit sub-pixel. In addition, when the unit compartment area 100 of the present disclosure is applied to the back light unit, it may be a unit control area for the local dimming driving. As such, multiple unit compartment areas 100 may be arranged on the display device or the back light unit. In addition, the unit compartment area 100 may also be disposed in other devices for individual driving other than the display device or the back light unit.

As described above, the MOSFETs MS1, MS2, and MD1 are connected to each other in each unit compartment area 100, so that the light emitting device $D_L$ in each unit compartment area 100 may be driven.

A unit light emitting area may be defined by the MOSFETs MS1, MS2, and MD1 connected to the data line $V_{DATA}$ and the scan line $V_{SCAN}$.

As mentioned above, there are the four main wirings $V_{DD}$, $V_{SS}$, $V_{DATA}$, and $V_{SCAN}$ in the single pixel. Such four wirings $V_{DD}$, $V_{SS}$, $V_{DATA}$, and $V_{SCAN}$ may include the scan line $V_{SCAN}$ connected to gate terminals of the switching MOSFETs MS1 and MS2, the data line $V_{DATA}$ connected to drain (or source) terminals of the switching MOSFETs MS1 and MS2, and the gate-on voltage line $V_{DD}$ connected to the anode of the light emitting device $D_L$.

In this regard, the gate-on voltage $V_{DD}$ corresponds to the highest voltage applied to drive the light emitting device $D_L$.

When the driving voltage $V_{DATA}$ and the common voltage $V_{SCAN}$ are applied, the switching operation in which the ON/OFF of the signal transmission is determined occurs in the switching unit 110.

By such a switching operation, the driver 120 determines the voltage substantially applied to the light emitting device $D_L$ based on the driving voltage $V_{DATA}$ and the current accordingly flowing through the light emitting device $D_L$.

That is, in the switching unit 110 including the first switching MOSFET MS1 and the second switching MOSFET MS2, the operation may occur in the switching area, and in the driver 120 including the driving MOSFET MD1, the operation may occur in the linear area before the saturation.

In this regard, the separate capacitor may not be disposed in the driving MOSFET MD1. That is, no capacitor is connected between the gate terminal and the drain (or source) terminal of the driving MOSFET MD1. In other words, a parasitic capacitance Cgs of the driving MOSFET MD1 may be used. This will be described in detail below.

As such, when the MOSFETs MS1, MS2, and MD1 are used for the switching unit 110 and the driver 120, there is no need to manufacture the thin film transistor (TFT), so that a manufacturing efficiency of the display device and the back light unit may be improved, and in addition, the cost of manufacturing the panel for this may be greatly reduced.

The manufacturing of the thin film transistor (TFT) requires a process of forming a thin film of a multi-layer structure, but a basic wiring process is mainly required for the manufacturing of the switching unit 110 and the driver 120 using the MOSFETs MS1, MS2, and MD1 described above.

In addition, because the MOSFET is applied, the driving voltage of the light emitting device (LED) may be relatively high, and a current acceptable limit may be high.

Usually, a driving current/voltage of several tens of mA and several tens of V is required to drive the high-luminance back light unit BLU. Because the MOSFET has an acceptable limit of hundreds of mA and hundreds of V, the MOSFET may be easily applied to such a high-luminance back light unit.

Figure 3:
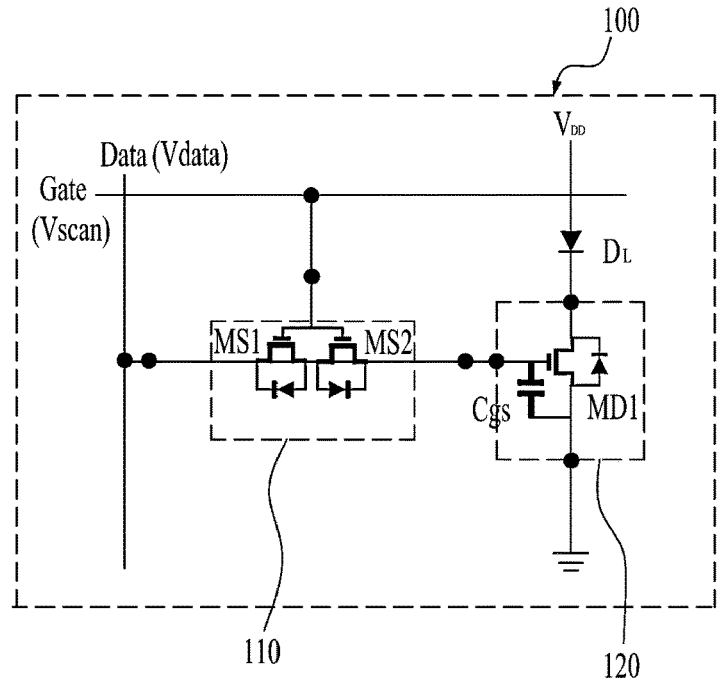
FIG. 3 is a circuit diagram showing a state in which a parasitic capacitance of a driver is shown of a unit compartment area of a display device according to an embodiment of the present disclosure.

FIG. 3 is a circuit diagram showing a state in which a parasitic capacitance of a driver is shown of a unit compartment area of a display device according to an embodiment of the present disclosure.

Figure 4:
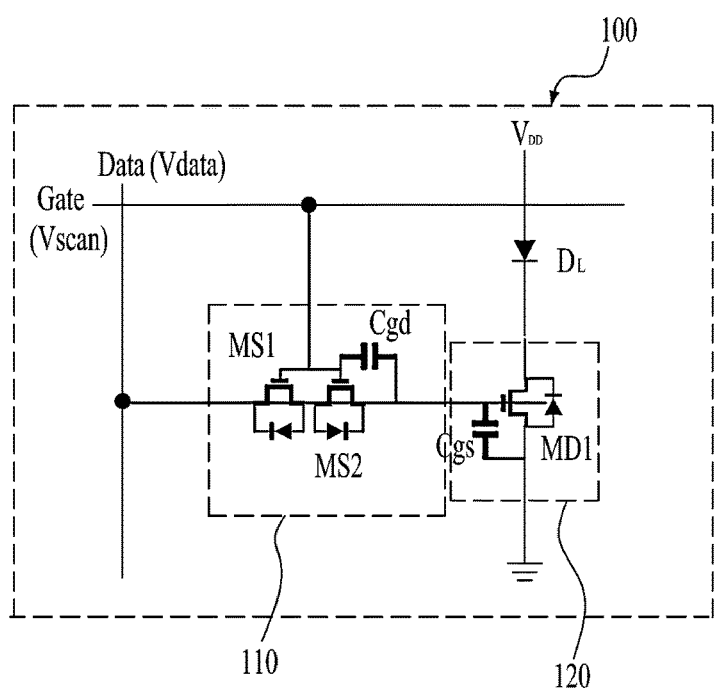
FIG. 4 is a circuit diagram showing a state in which parasitic capacitances of a switching unit and a driver are shown of a unit compartment area of a display device according to an embodiment of the present disclosure.

FIG. 4 is a circuit diagram showing a state in which parasitic capacitances of a switching unit and a driver are shown of a unit compartment area of a display device according to an embodiment of the present disclosure.

The unit compartment area shown in FIG. 3 is the same as that of FIG. 2, but the parasitic capacitance Cgs between a gate and a source included in the driving MOSFET MD1 included in the driver 120 is shown. In addition, in FIG. 4, a parasitic capacitance Cgd between a gate and a drain of the second switching MOSFET MS2 of the switching unit 110 is shown.

In general, the MOSFET has the parasitic capacitance. In addition, the gate of the MOSFET is insulated from the drain and the source by a gate oxide film. In addition, a PN junction is formed between the drain and the source via the substrate, so that a parasitic diode exists. Such parasitic diode is indicated on each MOSFET in FIGS. 2 and 3.

Cgs, which is the capacitance between the gate and the source, and Cgd, which is the capacitance between the gate and the drain, may be determined based on a capacitance of the gate oxide film. In addition, Cds, which is the capacitance between the drain and the source, is a junction capacitance of the parasitic diode.

Such capacitance may be provided in a data sheet of the MOSFET. For example, Ciss, Coss, and the like may be provided.

Ciss is an input capacitance. It is a sum of the capacitance Cgs between the gate and the source and the capacitance Cgd between the gate and the drain, and is a capacitance of the entire MOSFET viewed from an input side. To operate the MOSFET, it is necessary to charge such capacitance. An amount of charge required to charge the Ciss is Qg.

Coss is an output capacitance. It is a sum of the capacitance Cds between the drain and the source and the capacitance Cgs between the gate and the drain, and is a total capacitance on an output side. When the Coss is great, even when the gate is turned off, a current caused by Coss flows on the output side, so that it may take some time until the output side is completely turned off. In other words, because an accumulated charge remains even after the MOSFET is turned off, the light emitting device $D_L$ may be driven for at least one frame without the separate capacitor.

Therefore, the separate capacitor may not be disposed in the driving MOSFET MD1 included in the driver 120.

In this regard, the parasitic capacitance Cgs of the driving MOSFET MD1 may be appropriately about 1 to 50 pF.

On the other hand, referring to FIG. 4, it may be advantageous to minimize the parasitic capacitance of the switching unit 110.

For example, the capacitance Cgd between the gate and the drain of the second switching MOSFET MS2 connected to the driver 120 may be appropriately about 1 to 10 pF.

In this regard, it is preferable that the capacitance Cgd between the gate and the drain of the second switching MOSFET MS2 is smaller than the capacitance Cgs between the gate and the source of the driving MOSFET MD1. This is because, when the capacitance Cgd between the gate and the drain of the second switching MOSFET MS2 is greater than the capacitance Cgs between the gate and the source of the driving MOSFET MD1, the voltage may not be maintained and a voltage drop may occur when the signal is turned off.

Figure 5:
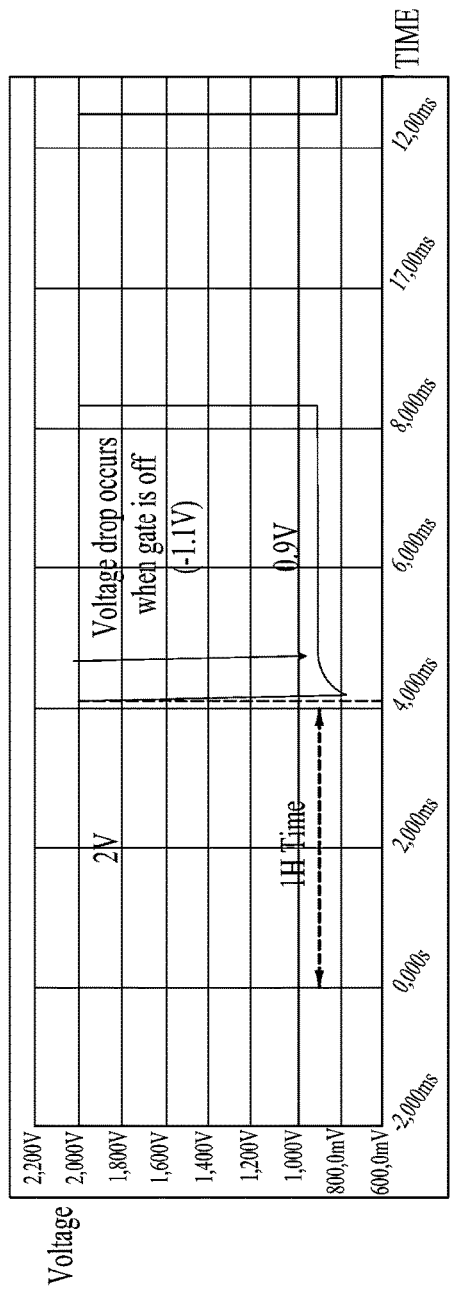
FIG. 5 is a spectrum diagram showing an example of a voltage pattern of a driver of a display device according to an embodiment of the present disclosure.
Figure 6:
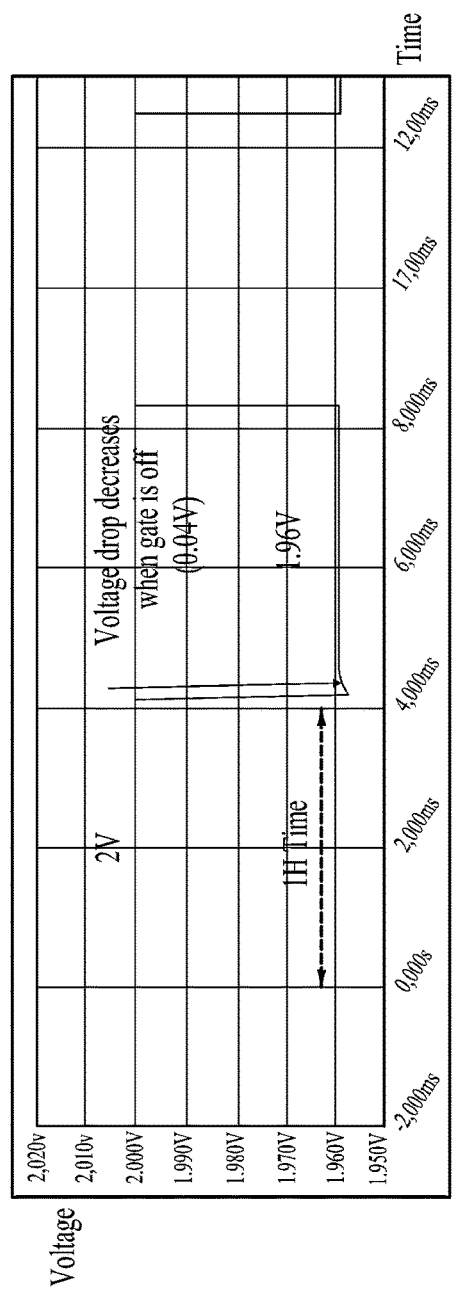
FIG. 6 is a spectrum diagram showing another example of a voltage pattern of a driver of a display device according to an embodiment of the present disclosure.

FIG. 5 is a spectrum diagram showing an example of a voltage pattern of a driver of a display device according to an embodiment of the present disclosure, and FIG. 6 is a spectrum diagram showing another example of a voltage pattern of a driver of a display device according to an embodiment of the present disclosure.

First, FIG. 5 shows a voltage pattern of the driver 120 when a capacitance of the switching unit 110 is greater than a capacitance of the driver 120.

Specifically, FIG. 5 shows a voltage pattern (an output voltage) of the driving MOSFET MD1 when the capacitance Cgd between the gate and the drain of the second switching MOSFET MS2 is greater than the capacitance Cgs between the gate and the source of the driving MOSFET MD1.

As shown, for example, when an initial gate voltage is 2 V, a gate voltage may be turned off (Gate off) after one frame 1H has passed. In this regard, in the situation shown in FIG. 5, for example, a great voltage drop (−1.1 V) may occur. Therefore, the gate voltage may be reduced to 0.9 V.

On the other hand, FIG. 6 shows a voltage pattern (an output voltage) when the capacitance Cgd between the gate and the drain of the second switching MOSFET MS2 is smaller than the capacitance Cgs between the gate and the source of the driving MOSFET MD1.

As shown, for example, when the initial gate voltage is 2 V, the gate voltage may be turned off (Gate off) after one write time (1H) has passed. In this regard, in the situation shown in FIG. 6, for example, a small voltage drop (−0.04 V) may occur. Therefore, the gate voltage may be reduced to 1.96 V and substantially the same current may flow through the driving MOSFET MD1.

This may be negligible or compensable when driving the display device or the back light unit.

Figure 7:
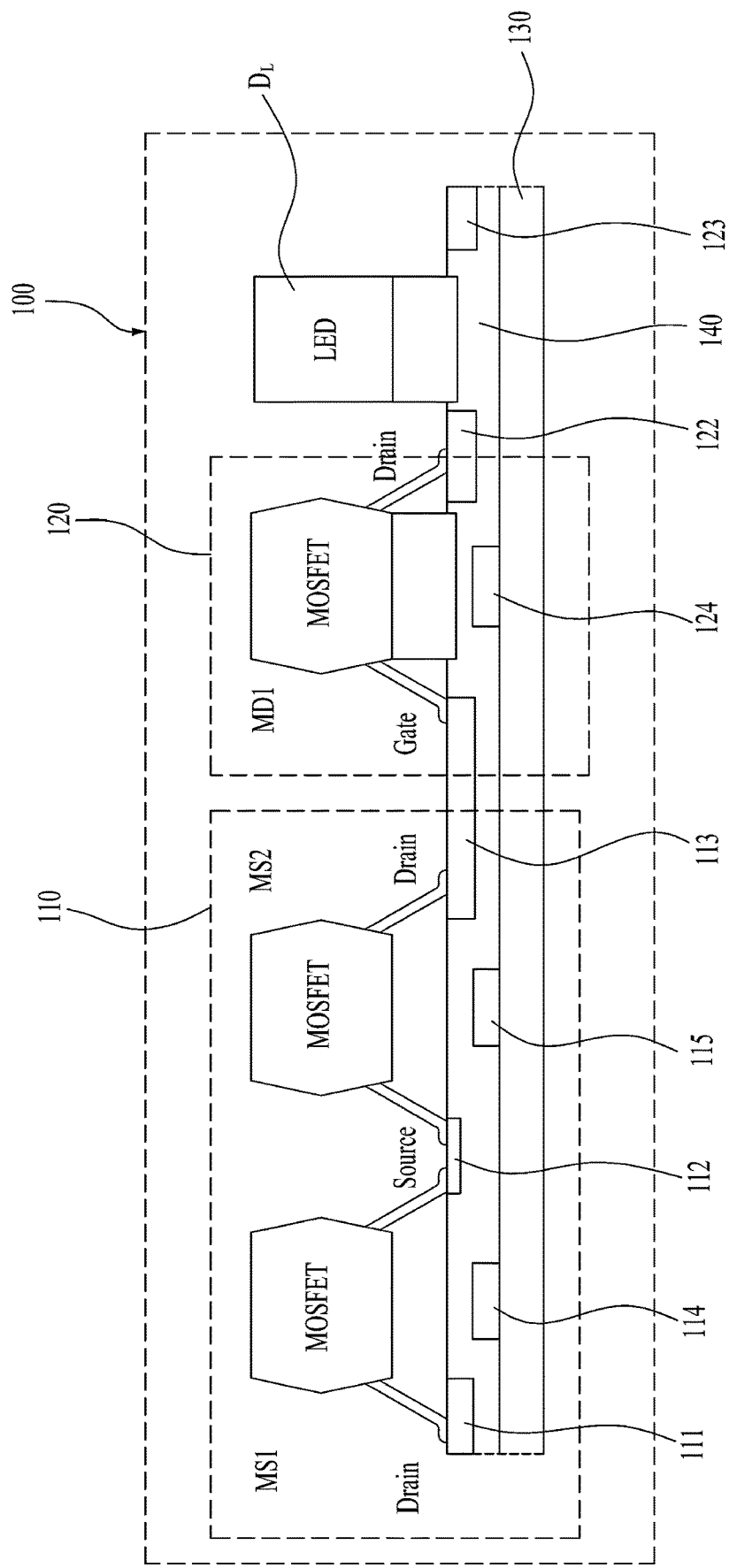
FIG. 7 is a schematic cross-sectional view of a unit compartment area of a display device according to an embodiment of the present disclosure.

FIG. 7 is a schematic cross-sectional view of a unit compartment area of a display device according to an embodiment of the present disclosure.

Referring to FIG. 7, actual implementation of the unit compartment area 100 may be performed in a wiring layer disposed on a substrate 130.

That is, the driving MOSFET MD1 and the switching MOSFETs MS1 and MS2 may be mounted on switching wiring layers 111, 112, 113, and 114 and driving wiring layers 122, 123, and 124 formed on the substrate 130. In this regard, the light emitting device $D_L$ may be mounted together with the driving MOSFET MD1.

In this regard, the substrate 130 may include the glass substrate.

Referring to FIG. 7, gate wirings 114 and 115 of the switching MOSFETs MS1 and MS2 may be located on the substrate 130 on a side of the switching unit 110. In addition, a source wiring 124 of the driving MOSFET MD1 may be located on a side of the driver 120. The gate wirings 114 and 115 and the source wiring 124 may be covered by an insulating layer 140.

A drain wiring 111 of the first switching MOSFET MS1 and a drain wiring 113 of the second switching MOSFET MS1 may be positioned on the insulating layer 140. In this regard, the source terminal of the first switching MOSFET MS1 and the source terminal of the second switching MOSFET MS1 may be connected to the common source wiring 112.

In addition, although not shown in FIG. 7, gate terminals of the switching MOSFETs MS1 and MS2 may be electrically connected to the gate wirings 114 and 115, respectively.

On the insulating layer 140, a wiring 113 to which the gate terminal of the driving MOSFET MD1 is connected on the side of the driver 120, the drain wiring 122 of the driving MOSFET MD1, and a connection wiring 123 on one side of the light emitting device $D_L$ may be arranged.

The wiring 113 to which the gate terminal of the driving MOSFET MD1 is connected may be common with the drain wiring 113 of the second switching MOSFET MS1.

In addition, the wiring 122 to which the drain terminal of the driving MOSFET MD1 is connected may be common with the connection wiring 122 on the other side of the light emitting device $D_L$.

On the other hand, although not shown in FIG. 7, the source terminal of the driving MOSFET MD1 may be electrically connected to the source wiring 124.

Figure 8:
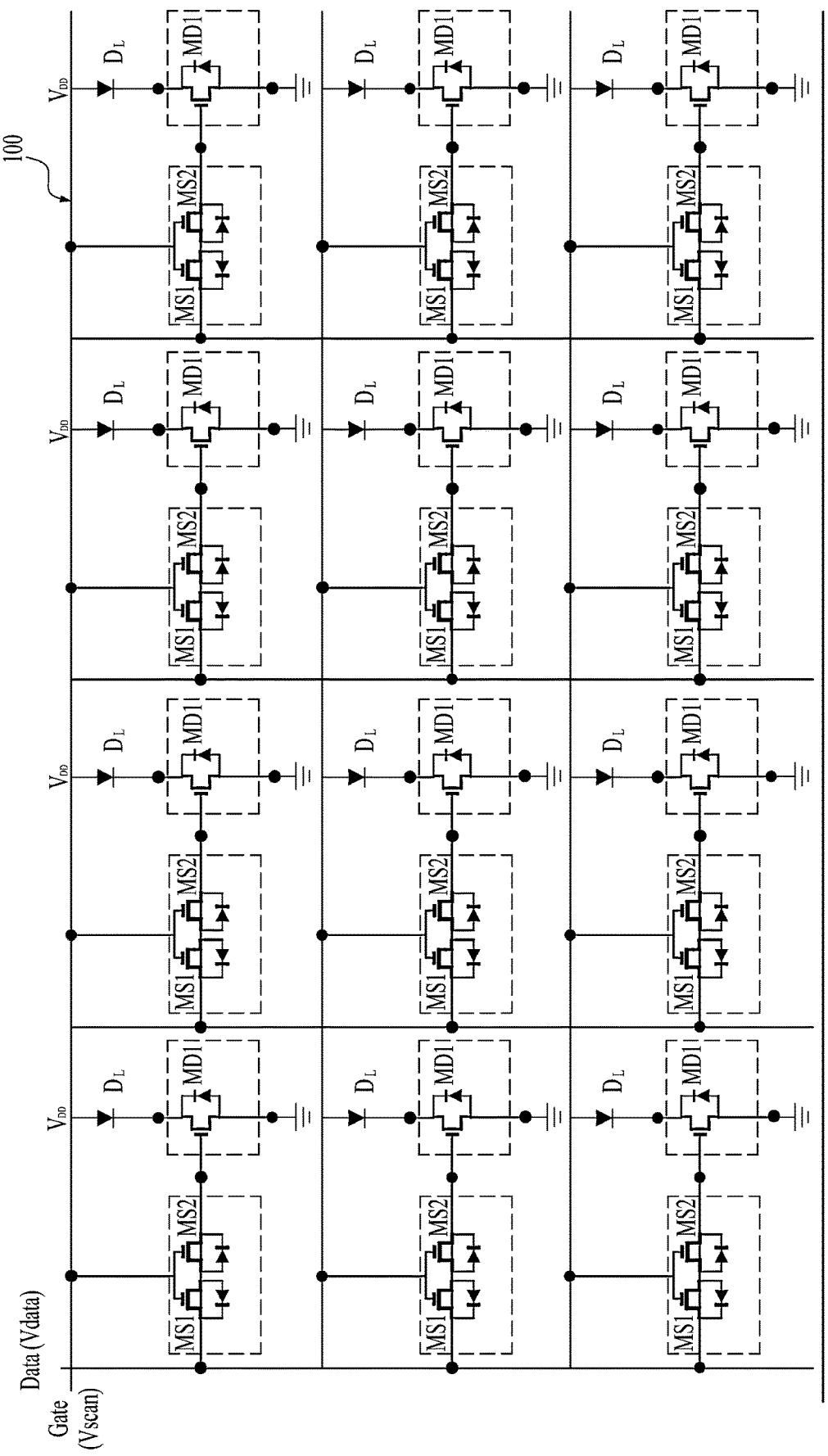
FIG. 8 is a circuit diagram illustrating a state in which multiple unit compartment areas of a display device are arranged, according to an embodiment of the present disclosure.

FIG. 8 is a circuit diagram illustrating a state in which multiple unit compartment areas of a display device are arranged, according to an embodiment of the present disclosure.

As shown in FIG. 8, the individual unit compartment areas 100 described above may be arranged horizontally and vertically to constitute the display device or the back light unit.

That is, each individual unit compartment area 100 in FIG. 8 may be the same as described above. Therefore, redundant descriptions are omitted.

As such, the multiple individual unit compartment areas 100 may be arranged and installed along the data line and the scan line.

Figure 9:
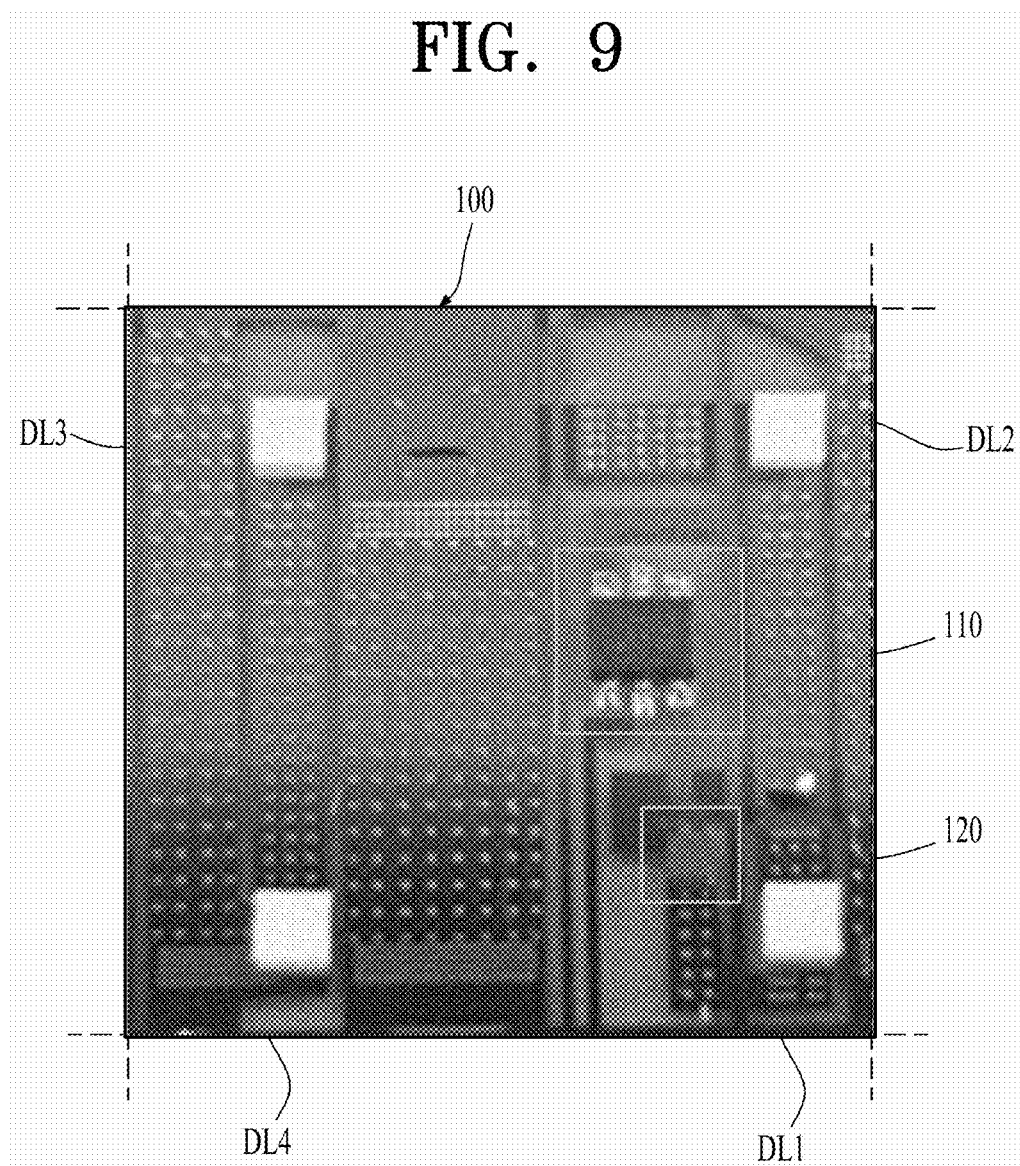
FIG. 9 is a plan view illustrating a unit compartment area of a display device according to an embodiment of the present disclosure.
Figure 10:
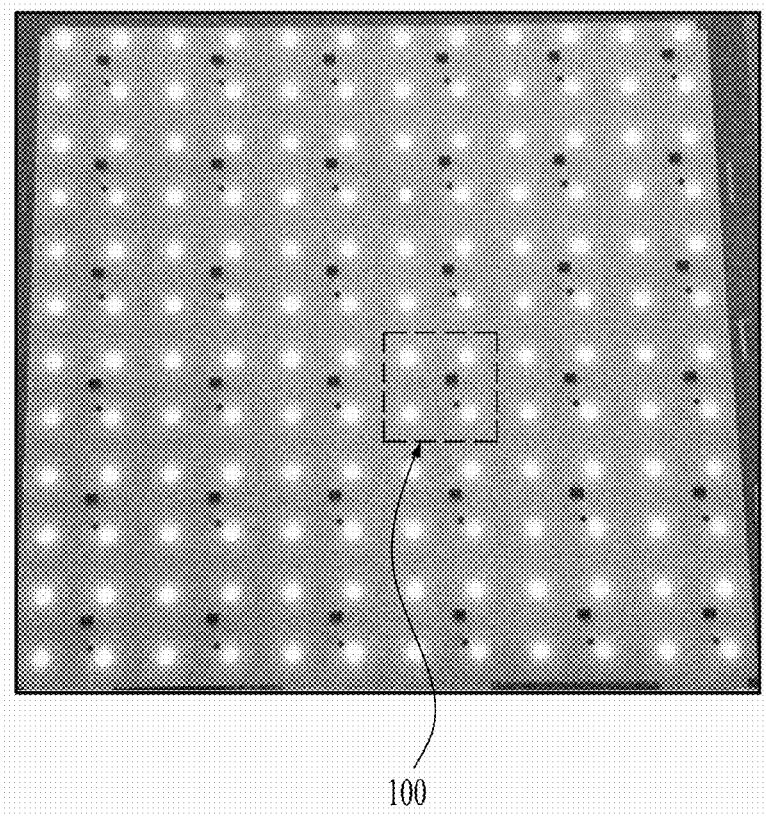
FIG. 10 is a photograph showing a back light unit according to an embodiment of the present disclosure.

FIG. 9 is a plan view illustrating a unit compartment area of a display device according to an embodiment of the present disclosure. FIG. 10 is a photograph showing a back light unit according to an embodiment of the present disclosure.

FIG. 9 shows a plane in which the circuit shown in FIG. 2 is actually implemented. A difference from FIG. 2 is that FIG. 9 shows an example in which four light emitting devices $D_{L1}$, $D_{L2}$, $D_{L3}$, and $D_{L4}$ are connected to each other in the unit compartment area 100.

That is, as shown in FIG. 2, one light emitting device $D_L$ may be disposed in the individual unit compartment area 100, but as shown in FIG. 9, the multiple light emitting devices $D_{L1}$, $D_{L2}$, $D_{L3}$, and $D_{L4}$ may be arranged.

As such, the multiple light emitting devices $D_L$ may be arranged in the individual unit compartment area 100. With such configuration, the multiple light emitting devices $D_L$ included in the individual unit compartment area 100 may simultaneously emit light.

As shown in FIG. 10, when the multiple light emitting devices $D_L$ are arranged in the individual unit compartment area 100 and used for the back light unit, the multiple light emitting devices $D_L$ may emit light of the same color. For example, the multiple light emitting devices $D_L$ may emit white light. As such light emitting device $D_L$ emitting the white light, at least one of a light emitting device that is converted in color by a phosphor and a light emitting device that emits the white light by a combination of red, green, and blue light emitting devices may be used.

In this regard, the individual unit compartment area 100 may correspond to a unit of the local dimming of the back light unit. As such, because the light emitting device $D_L$ may be turned on/off and/or the brightness may be adjusted for each individual unit compartment area, for example, when the back light unit is used in the liquid crystal display device, the contrast ratio may be improved.

Figure 11:
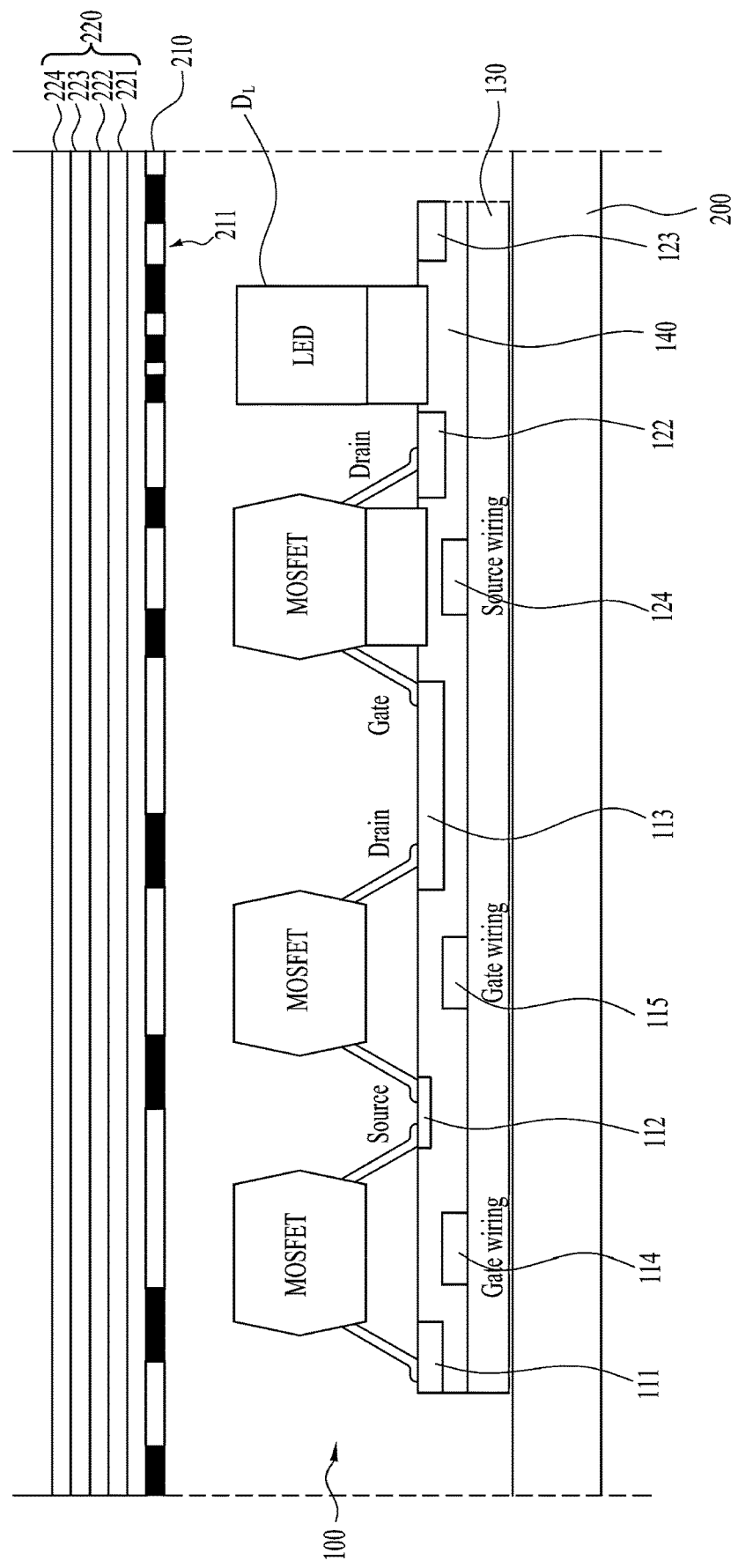
FIG. 11 is a cross-sectional schematic diagram of a unit compartment area of a back light unit according to an embodiment of the present disclosure.

FIG. 11 is a cross-sectional schematic diagram of a unit compartment area of a back light unit according to an embodiment of the present disclosure.

As a specific embodiment, FIG. 11 shows the back light unit to which the above-described individual unit compartment area 100 is applied.

A state of the individual unit compartment area 100 shown in FIG. 11 may be substantially the same as the state shown in FIG. 7.

Such individual unit compartment area 100 may be disposed on a lower cover 200. In addition, the multiple individual unit compartment areas 100 may be arranged with an arrangement corresponding to a size of the display device.

An optical sheet 220 may be disposed on the arrangement of the unit compartment areas 100. The optical sheet 220 may improve characteristics of light emitted from the light emitting device $D_L$. For example, the optical sheet 220 may improve uniformity of the light emitted from the light emitting devices $D_L$.

The optical sheet 220 may include, for example, a diffusion layer 221, a lower polarizing plate 222, a color filter substrate 223, and an upper polarizing plate 224.

In one example, a reflective layer 210 having a hole pattern 211 capable of transmitting light may be positioned between the arrangement of the unit compartment areas 100 and the optical sheet 220.

The reflective layer 210 may use a reflective sheet that transmits only a portion of the light emitted from the light emitting device $D_L$ and reflects the rest.

Such reflective layer 210 is a hole patterned 211 reflective sheet, and multiple holes 211 may be defined in the sheet. That is, the light emitted from the light emitting device $D_L$ passes through the hole 211, and light hitting other areas may be re-reflected or refracted or reflected by other structures.

Further, radii of the holes 211 may increase as a distance from a center of the light emitting device $D_L$ increases, so that an amount of transmission of light may be greater than an amount of reflection as the distance from the light emitting device $D_L$ increases.

This is because the closer the light emitting device $D_L$, the higher the intensity of the light, and the farther away from the light emitting device $D_L$, the lower the intensity of the light. To keep the luminance of light uniform throughout the display panel using such a planar lighting device, it is advantageous that the amount of transmission increases as the distance from the light emitting device $D_L$ increases and decreases as the distance from the light emitting device $D_L$ decreases.

In one example, although not shown, an upper cover may be positioned on the optical sheet 220.

In addition, when a liquid crystal panel is disposed on such a planar lighting device, the liquid crystal display device may be implemented. Therefore, the scope of application of the present disclosure includes the liquid crystal display device.

FIGS. 12 to 17 are schematic diagrams showing driving states of a unit compartment area using a MOSFET.

Figure 14:
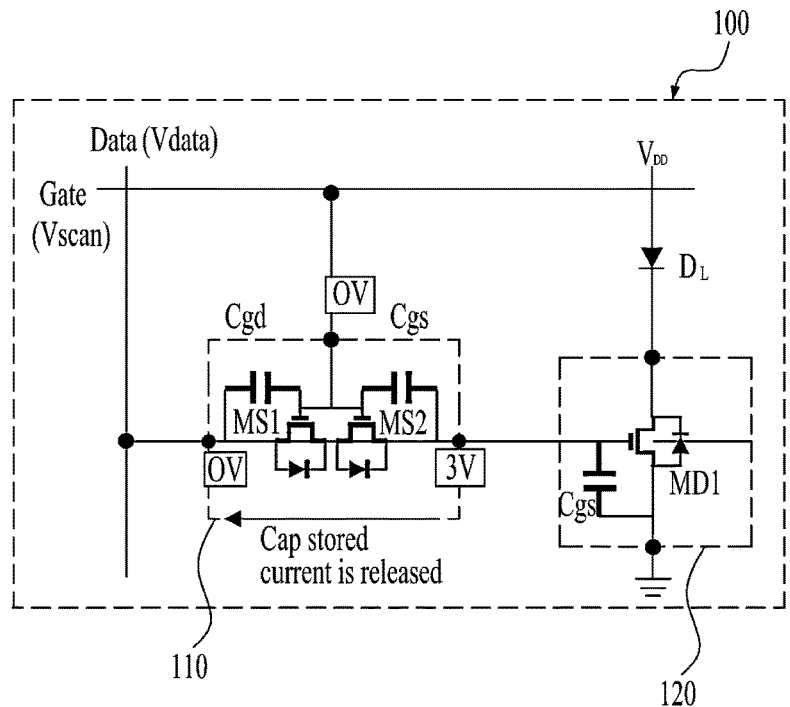
Figure 15:
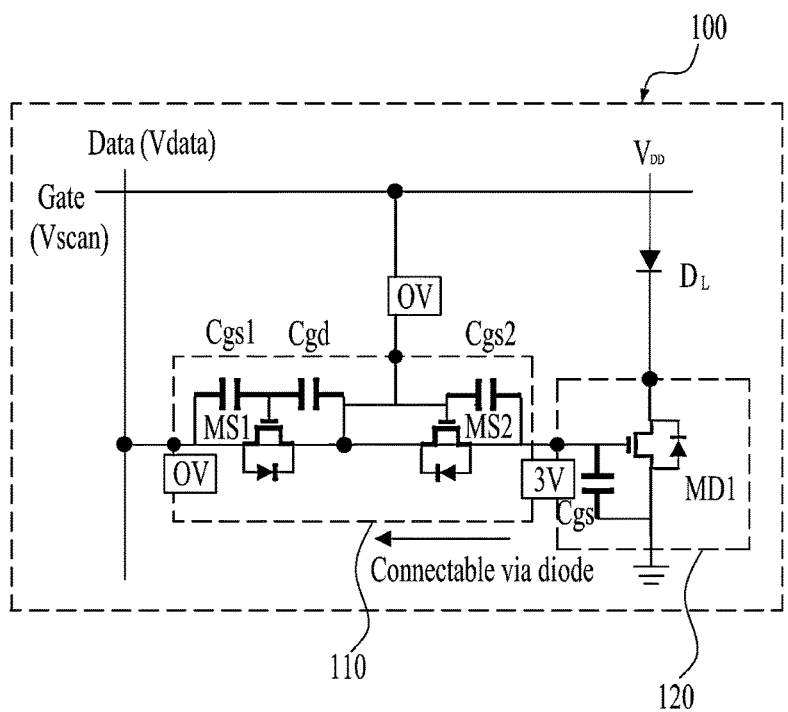
Figure 16:
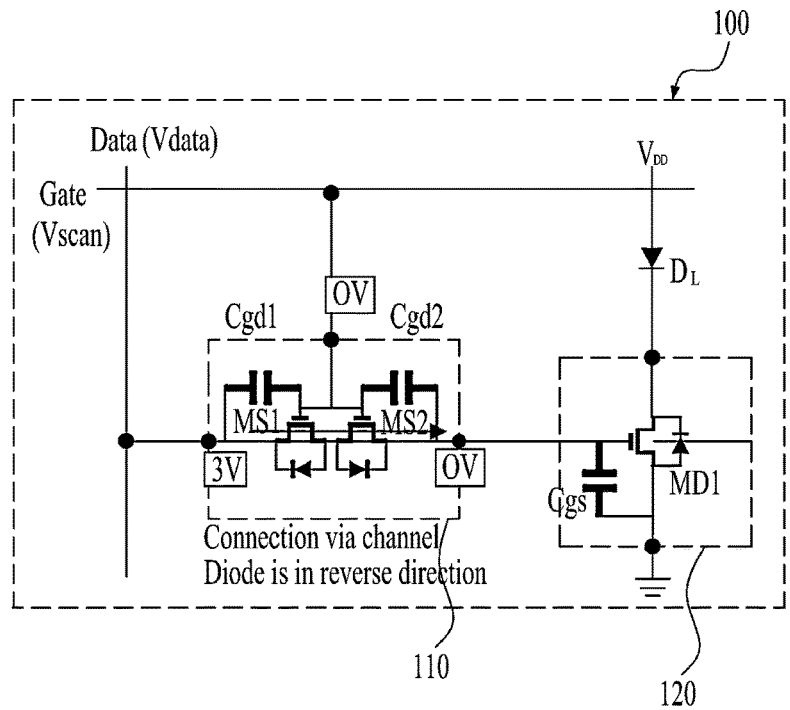
FIGS. 16 and 17 are schematic diagrams showing driving states of a unit compartment area using a MOSFET, and show examples of normal driving according to an embodiment of the present disclosure.
Figure 17:
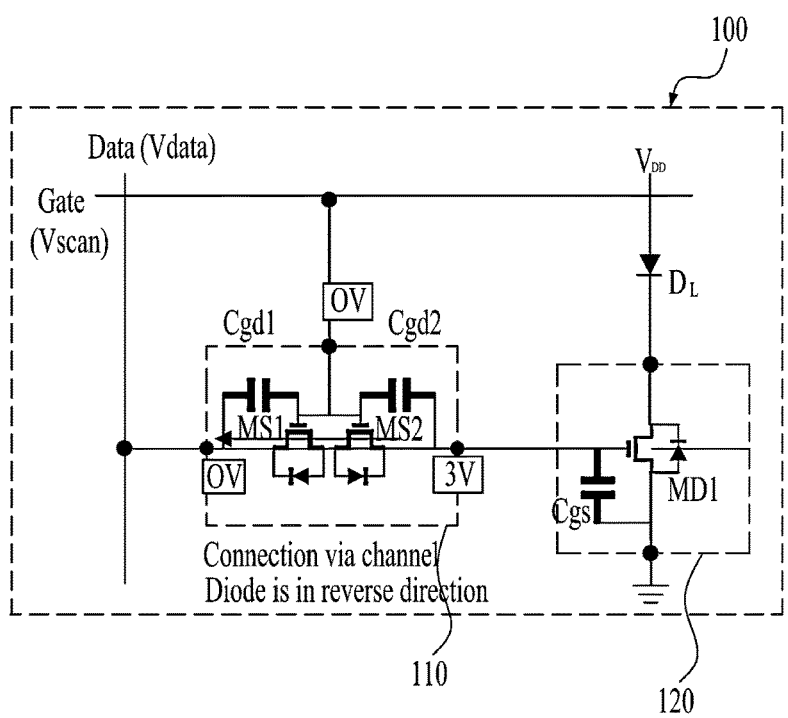

FIGS. 12 to 15 show examples of abnormal driving, and FIGS. 16 and 17 show examples of normal driving according to an embodiment of the present disclosure.

Figure 12:
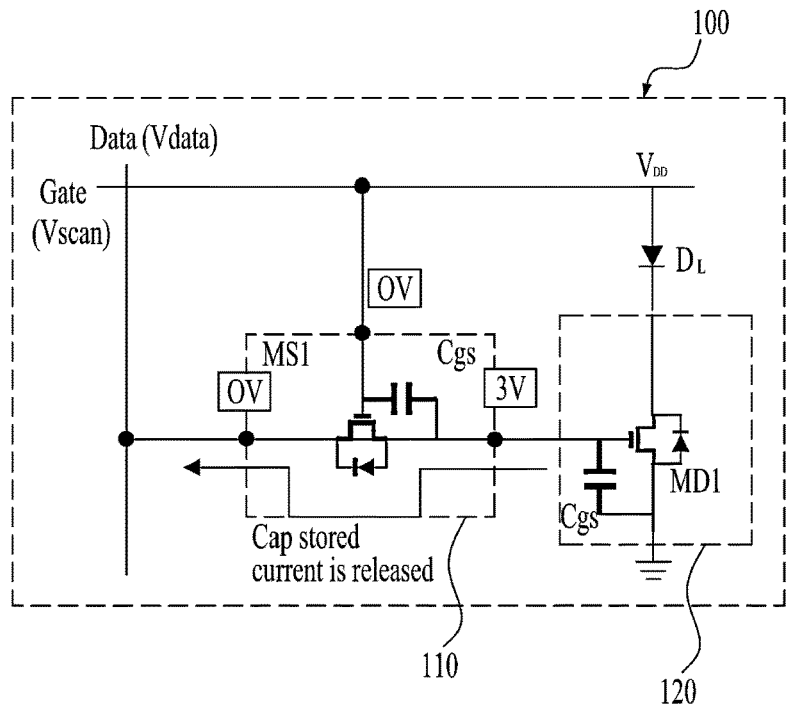
FIGS. 12 to 15 are schematic diagrams showing driving states of a unit compartment area using a MOSFET, and show examples of abnormal driving.

First, FIG. 12 shows a case in which one MOSFET MS1 is used in the switching unit 110.

In such state, when a write signal (e.g., 3 V) is applied to the data line (Data) $V_{DATA}$, the parasitic capacitance 3 V of the switching unit 110 may be charged. However, when the scan line (Gate) $V_{SCAN}$ is turned off (0 V) thereafter, the data voltage is released to the data line by a parasitic diode (an intrinsic diode) of the switching MOSFET MS1 of the switching unit 110.

That is, a current stored in a parasitic capacitor is released along the parasitic diode of the switching MOSFET MS1, and thus the normal driving cannot be performed.

Figure 13:
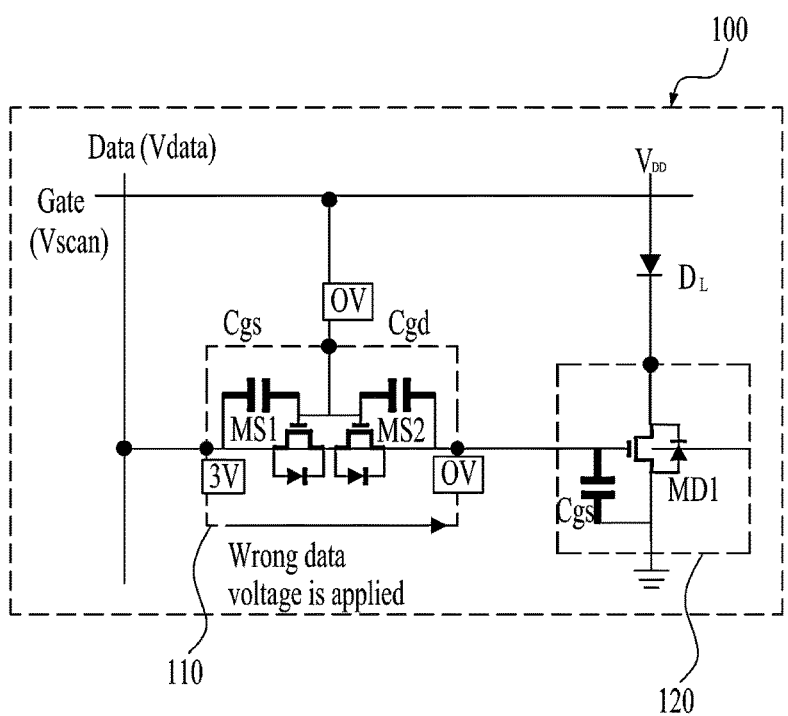

FIG. 13 shows a case in which the two MOSFETs MS1 and MS2 are used in the switching unit 110. However, such two MOSFETs MS1 and MS2 are connected to each other to face the same direction. Therefore, parasitic diodes (intrinsic diodes) of the two MOSFETs MS1 and MS2 are connected to each other to face the same direction. In this regard, the parasitic diodes (intrinsic diodes) face the driver 120.

In this regard, unlike the case in FIG. 12 above, when an erase signal (e.g., 0 V) is applied to the data line (Data) $V_{DATA}$, the parasitic capacitance is discharged and set to 0 V.

However, when the write signal (e.g., 3 V) is applied to the data line (Data) $V_{DATA}$ after the scan line (Gate) $V_{SCAN}$ is turned off (0 V), the parasitic diodes (intrinsic diodes) of the MOSFETs MS1 and MS2 cause a change in the data voltage. This causes the data voltage to be reduced by twice the threshold voltage Vth of the parasitic diodes, making the normal driving impossible.

FIG. 14 shows a case in which the two MOSFETs MS1 and MS2 are used in the switching unit 110. However, such two MOSFETs MS1 and MS2 are connected to each other to face the same direction. Therefore, the parasitic diodes (intrinsic diodes) of the two MOSFETs MS1 and MS2 are connected to each other to face the same direction. In this regard, the direction of the parasitic diode (intrinsic diode) faces the opposite direction of the driver 120.

In this case, the current stored in the parasitic capacitor is released along the parasitic diode of the switching MOSFET MS1, and thus the normal driving cannot be achieved. That is, the same driving abnormality as that in the case shown in FIG. 12 occurs.

FIG. 15 shows a case in which the two MOSFETs MS1 and MS2 are used in the switching unit 110. Such two MOSFETs MS1 and MS2 are connected to each other to face opposite directions. However, unlike the case in FIG. 2 described above, the gate terminals of the switching unit 110 are not commonly connected.

That is, in this case, the two MOSFETs MS1 and MS2 are connected to each other to face the opposite directions, but a connection scheme is different from that of the case in FIG. 2. In this case, a magnitude of an equivalent capacitance of the driver 120 increases and thus, the drop of the data voltage increases.

In this regard, when a parasitic diode adjacent to the parasitic capacitor of the right switching MOSFET MS2 of the switching unit 110 is turned on in a forward direction, the capacitance of the switching unit 110 connected to the capacitance Cgs of the driver 120 increases.

Specifically, the capacitance Cgd between the gate and the drain of the left switching MOSFET MS1 and the capacitance Cgs2 between the gate and the source of the right switching MOSFET MS2 increase. Accordingly, the magnitude of the switching capacitance increases, and thus the drop in data voltage may occur.

FIGS. 16 and 17 show the case in which the two MOSFETs MS1 and MS2 are used in the switching unit 110. Such two MOSFETs MS1 and MS2 are connected to each other to face the opposite directions as in the case in FIG. 2. That is, FIGS. 16 and 17 show the same state as that in the case in FIG. 2 described above.

FIG. 16 shows a (write) state in which data is written in the unit compartment area (or the pixel area), and FIG. 17 shows a (erase) state in which the data is erased in the unit compartment area (or the pixel area).

In the case shown in FIGS. 16 and 17, there is no effect of the parasitic diode (intrinsic diode) in the write and erase states of the data voltage. Accordingly, the capacitance Cgs of the switching unit 110 connected to the capacitance Cgs of the driver 120 becomes small, enabling the normal operation as described above.

In the case of the data writing in FIG. 16, 3 V is applied to a left side of the left switching MOSFET MS1, and the direction of the parasitic diode becomes a reverse direction via connection via a channel.

In addition, in the case of the data erasing in FIG. 17, 3 V is applied to a right side of the right switching MOSFET MS2, and in this case also, the direction of the parasitic diode becomes the reverse direction via the connection via the channel.

As described above, according to the present disclosure, the display device or the planar lighting device (the back light unit) including the multiple individual unit compartment areas driven by the active matrix (AM) scheme may be provided.

As mentioned above, to improve the contrast ratio in the display device that requires the backlight, such as the liquid crystal display device, the local dimming function of the back light unit BLU is required, which may be implemented via the AM driving having the configuration described in the present disclosure.

For the optimal implementation of the local dimming, the larger the number of local dimming zones that may be driven individually, the better. According to the present disclosure, because the number of local dimming zones may theoretically be increased by the number of pixels, the effect of the local dimming may be greatly improved.

Because the display device according to the present disclosure does not require the manufacture of the thin film transistor (TFT), the manufacturing efficiency may be improved and the display panel manufacturing cost may be greatly reduced.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

INDUSTRIAL APPLICABILITY

According to the present disclosure, the display device and the planar lighting device using the light emitting device (LED) and the liquid crystal display device using the same may be provided.

What is claimed is:

1. A display device including multiple individual unit compartment areas, the display device comprising:
   at least one light emitting device disposed in an individual unit compartment area;
   a gate-on voltage line connected to the at least one light emitting device;
   a scan line for applying a common voltage to the multiple individual unit compartment areas;
   a data line for applying individual switching voltages to the multiple individual unit compartment areas;
   a driver including a driving MOSFET connected to the at least one light emitting device; and a switching unit including a switching MOSFET connected to the scan line and the data line to perform a switching operation,
wherein a parasitic capacitance between a gate and a drain of the switching MOSFET is smaller than a parasitic capacitance between a gate and a source of the driving MOSFET.

2. The display device of claim 1, wherein the switching unit includes:
the switching MOSFET being a first switching MOSFET; and
a second switching MOSFET connected in parallel with the first switching MOSFET with respect to the scan line.

3. The display device of claim 2, wherein the first switching MOSFET and the second switching MOSFET are connected in a reverse direction.

4. The display device of claim 3, wherein the first switching MOSFET and the second switching MOSFET are connected so that source terminals thereof face each other.

5. The display device of claim 1, wherein the at least one light emitting device is driven in units of the multiple individual unit compartment areas.

6. The display device of claim 1, wherein at least one of the driving MOSFET or the switching MOSFET is mounted on a wiring layer formed on a substrate.

7. The display device of claim 6, wherein the substrate includes a glass substrate.

8. The display device of claim 1, wherein the driver does not have a separate capacitor.

9. A planar lighting device using at least one light emitting device for driving the at least one light emitting device in units of multiple individual unit compartment areas, the planar lighting device comprising:
the at least one light emitting device disposed in an individual unit compartment area;
a gate-on voltage line connected to the at least one light emitting device;
a scan line for applying a common voltage to the multiple individual unit compartment areas;
a data line for applying individual switching voltages to the multiple individual unit compartment areas;
a driver including a driving MOSFET connected to the at least one light emitting device;
a switching unit including a switching MOSFET connected to the scan line and the data line to perform a switching operation; and
an optical sheet located on the at least one light emitting device,
wherein a parasitic capacitance between a gate and a drain of the switching MOSFET is smaller than a parasitic capacitance between a gate and a source of the driving MOSFET.

10. The lighting device of claim 9, wherein the individual unit compartment area corresponds to a unit of local dimming.

11. The lighting device of claim 9, wherein the at least one light emitting device disposed in the individual unit compartment area emits light of a single color.

12. The lighting device of claim 9, wherein the switching unit includes:
the switching MOSFET being a first switching MOSFET; and
a second switching MOSFET connected in parallel with the first switching MOSFET with respect to the scan line.

13. The lighting device of claim 12, wherein the first switching MOSFET and the second switching MOSFET are connected in a reverse direction.

14. The lighting device of claim 13, wherein the first switching MOSFET and the second switching MOSFET are connected to each other so that source terminals thereof face each other.

15. The lighting device of claim 9, wherein the at least one light emitting device is driven in the units of the multiple individual unit compartment areas.

16. The lighting device of claim 9, wherein at least one of the driving MOSFET or the switching MOSFET is mounted on a wiring layer formed on a substrate.

17. The lighting device of claim 16, wherein the substrate includes a glass substrate.

18. The lighting device of claim 9, wherein the driver does not have a separate capacitor.

19. A display device including multiple individual unit compartment areas, the display device comprising:
at least one light emitting device disposed in an individual unit compartment area;
a gate-on voltage line connected to the at least one light emitting device;
a scan line for applying a common voltage to the multiple individual unit compartment areas;
a data line for applying individual switching voltages to the multiple individual unit compartment areas;
a driver including a driving MOSFET connected to the at least one light emitting device; and
a switching unit including a switching MOSFET connected to the scan line and the data line to perform a switching operation,
wherein the switching unit includes:
the switching MOSFET being a first switching MOSFET; and
a second switching MOSFET connected in parallel with the first switching MOSFET with respect to the scan line,
wherein the first switching MOSFET and the second switching MOSFET are connected in a reverse direction, and
wherein the first switching MOSFET and the second switching MOSFET are connected so that source terminals thereof face each other.

20. A planar lighting device using at least one light emitting device for driving the at least one light emitting device in units of multiple individual unit compartment areas, the planar lighting device comprising:
the at least one light emitting device disposed in an individual unit compartment area;
a gate-on voltage line connected to the at least one light emitting device;
a scan line for applying a common voltage to the multiple individual unit compartment areas;
a data line for applying individual switching voltages to the multiple individual unit compartment areas;
a driver including a driving MOSFET connected to the at least one light emitting device;
a switching unit including a switching MOSFET connected to the scan line and the data line to perform a switching operation; and
an optical sheet located on the at least one light emitting device,
wherein the switching unit includes:
the switching MOSFET being a first switching MOSFET; and a second switching MOSFET connected in parallel with the first switching MOSFET with respect to the scan line, wherein the first switching MOSFET and the second switching MOSFET are connected in a reverse direction, and wherein the first switching MOSFET and the second switching MOSFET are connected to each other so that source terminals thereof face each other.

* * * * *